(12) United States Patent
Gilges et al.

(10) Patent No.: US 10,897,831 B2
(45) Date of Patent: Jan. 19, 2021

(54) DATA CENTER STRANDED POWER RECOVERY DESIGN

(71) Applicant: Microsoft Technology Licensing, LLC, Redmond, WA (US)

(72) Inventors: Stephan W. Gilges, Seattle, WA (US); Keith A. Krueger, Monroe, WA (US); Robert G. Allison, Shoreline, WA (US); Jayanthi Lakshmanan, Redmond, WA (US); Glen Robert Beyer, Sammamish, WA (US); Yidian Sun, Seattle, WA (US); Scott T. Seaton, Kirkland, WA (US); Daniel David Woodman, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1 day.

(21) Appl. No.: 15/990,166

(22) Filed: May 25, 2018

(65) Prior Publication Data
US 2019/0364687 A1    Nov. 28, 2019

(51) Int. Cl.
*H05K 7/14* (2006.01)

(52) U.S. Cl.
CPC ......... *H05K 7/1497* (2013.01); *H05K 7/1492* (2013.01); *H05K 7/1498* (2013.01)

(58) Field of Classification Search
CPC .................. H05K 7/1492; H05K 7/1485–1498
See application file for complete search history.

(56) References Cited

U.S. PATENT DOCUMENTS

| | | | | |
|---|---|---|---|---|
| 8,032,768 B2 * | 10/2011 | Brundridge | ......... | H05K 7/1498 710/104 |
| 2015/0234440 A1 | 8/2015 | Gardner et al. | | |
| 2015/0319878 A1 | 11/2015 | Morales et al. | | |
| 2015/0331467 A1 * | 11/2015 | Kaplan | ................... | H02J 9/066 713/300 |
| 2015/0378408 A1 * | 12/2015 | Kaplan | ................ | H05K 7/1492 713/300 |
| 2016/0209901 A1 * | 7/2016 | Wilcox | ................ | H05K 7/1492 |
| 2016/0274638 A1 * | 9/2016 | Kwon | ....................... | G06F 1/28 |
| 2017/0010652 A1 * | 1/2017 | Huang | .................. | G06F 1/3234 |

FOREIGN PATENT DOCUMENTS

WO    2015175289 A1    11/2015

OTHER PUBLICATIONS

"International Search Report and Written Opinion Issued in PCT Application No. PCT/US19/032078", dated Jul. 26, 2019, 11 Pages.

* cited by examiner

*Primary Examiner* — Rexford N Barnie
*Assistant Examiner* — David A Shiao
(74) *Attorney, Agent, or Firm* — Fiala & Weaver P.L.L.C.

(57) ABSTRACT

Methods, systems, and apparatuses are described that enable the recovery of stranded power in a data center. For example, a power distribution system for recovering stranded power in a data center includes a first power distribution unit (PDU), a first busway segment that is operable to electrically connect the first PDU to a first set of server racks in a first row of server racks, a second busway segment that is operable to electrically connect the first PDU to a second set of server racks in a second row of server racks, a second PDU, a third busway segment that is operable to electrically connect the second PDU to a third set of server racks in a third row of server racks, and a fourth busway segment that is operable to electrically connect the second PDU to a fourth set of server racks in the second row of server racks.

20 Claims, 5 Drawing Sheets

DATA CENTER STRANDED POWER RECOVERY DESIGN

BACKGROUND

Data centers, such as those used to support cloud computing, demand massive amounts of uninterrupted power to operate successfully and seamlessly. The distribution and management of power in a data center may be accomplished through the use of power distribution units (PDUs) and busways. A PDU is a component in an electrical infrastructure designed to distribute power from upstream electrical path(s) (e.g., a primary power source of a building) to downstream loads (e.g., equipment racks in a data center). Busways generally serve as an agile solution (as opposed to cable or conduit) to channel power from PDUs to one or more rows of server racks in a data center.

Typically, a PDU has a fixed capacity of electrical power that is equal to the electrical capacity of other PDUs within a data center. This enables for maximal utilization of power capacity of the data center. A lack of load balancing across PDUs within a data center may lead to unused or stranded power and underutilization of electrical infrastructure. Stranded power is the electricity that is wasted or unable to be used. When measured across an entire data center, this stranded power may amount to a staggering waste of power resources and expensive infrastructure. Additionally, if a data center runs out of power capacity, then a cloud service provider is required to build or rent another data center to provide its services.

Due to variability in power needs of workloads (i.e., applications and other software running on the servers in a data center), it can be difficult to assign workloads in a data center for maximal utilization of power capacity of a data center. This is further exacerbated by the deployment of workloads to servers at a row level rather than at a rack level. As a result, PDUs may become underutilized and power provided by PDUs stranded.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods, systems, and apparatuses are described herein that enable the recovery of stranded power in a data center. For example, a power distribution system for recovering stranded power in a data center includes a first power distribution unit (PDU), a first busway segment that is operable to electrically connect the first PDU to a first set of server racks in a first row of server racks, a second busway segment that is operable to electrically connect the first PDU to a second set of server racks in a second row of server racks, a second PDU, a third busway segment that is operable to electrically connect the second PDU to a third set of server racks in a third row of server racks, and a fourth busway segment that is operable to electrically connect the second PDU to a fourth set of server racks in the second row of server racks.

Additionally, the power distribution system may further include a third PDU, a fifth busway segment that is operable to electrically connect the third PDU to a fifth set of server racks in a fourth row of server racks, and a sixth busway segment that is operable to electrically connect the third PDU to a sixth set of server racks in the second row of server racks.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the application and, together with the description, further serve to explain the principles of the embodiments and to enable a person skilled in the relevant art(s) to make and use the embodiments.

Figure 1:
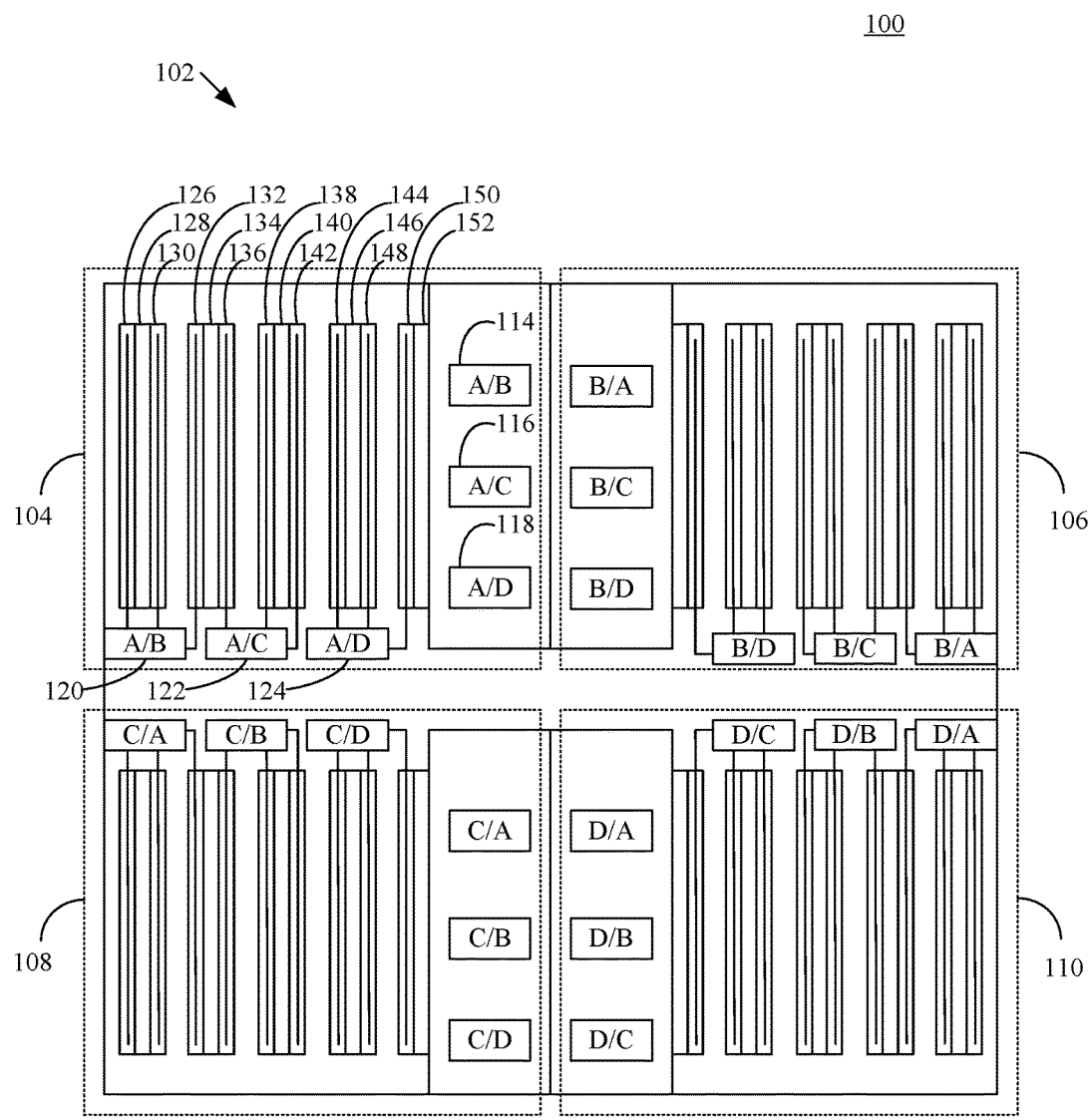
FIG. 1 is a block diagram of an example power distribution system for a data center, according to an example embodiment.

The features and advantages of the embodiments described herein will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The following detailed description discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of persons skilled in the relevant art(s) to implement such feature, structure, or characteristic in connection with other embodiments whether or not explicitly described.

In the discussion, unless otherwise stated, adjectives such as "substantially," "approximately," and "about" modifying a condition or relationship characteristic of a feature or features of an embodiment of the disclosure, are understood to mean that the condition or characteristic is defined to within tolerances that are acceptable for operation of the embodiment for an application for which it is intended.

Numerous exemplary embodiments are described as follows. It is noted that any section/subsection headings provided herein are not intended to be limiting. Embodiments are described throughout this document, and any type of embodiment may be included under any section/subsection. Furthermore, embodiments disclosed in any section/subsection may be combined with any other embodiments described in the same section/subsection and/or a different section/subsection in any manner.

II. Example Embodiments

Data centers, such as those used to support cloud computing, demand massive amounts of uninterrupted power to operate successfully and seamlessly. The distribution and management of power in a data center may be accomplished through the use of power distribution units (PDUs) and busways. A PDU is a component in an electrical infrastructure designed to distribute power from upstream electrical path(s) (e.g., a primary power source of a building) to downstream loads (e.g., equipment racks in a data center). Busways generally serve as an agile solution (as opposed to cable or conduit) to channel power from PDUs to one or more rows of server racks in a data center.

Typically, a PDU has a fixed capacity of electrical power that is equal to the electrical capacity of other PDUs within a data center. This enables for maximal utilization of power capacity of the data center. A lack of load balancing across PDUs within a data center may lead to unused or stranded power and underutilization of electrical infrastructure. Stranded power is the electricity that is wasted or unable to be used. When measured across an entire data center, this stranded power may amount to a staggering waste of power resources and expensive infrastructure. Additionally, if a data center runs out of power capacity, then a cloud service provider is required to build or rent another data center to provide its services.

Due to variability in power needs of workloads (i.e., applications and other software running on the servers in a data center), it can be difficult to assign workloads in a data center for maximal utilization of power capacity of a data center. This is further exacerbated by the deployment of workloads to servers at a row level rather than at a rack level. As a result, PDUs may become underutilized and power provided by PDUs stranded.

To help illustrate the foregoing, FIG. 1 is described. FIG. 1 shows a block diagram of an example power distribution system 100 for a data center, according to an example embodiment. As shown in FIG. 1, a data center 102 includes cells 104, 106, 108, and 110. Each cell is a discrete power distribution system within the data center and is provided power by a primary power source and secondary power sources. A primary power source and secondary power sources may be power generated by a public utility or a private generation facility. For example, as shown in FIG. 1, cell 104 is provided power from a primary power source A, cell 106 is provided power from a primary power source B, cell 108 is provided power from a primary power source C, and cell 110 is provided power from a primary power source D. Each primary power source also serves as a secondary power source for cells that it is not servicing as a primary power source.

As further shown in FIG. 1, cell 104 includes static switches 114, 116, and 118. Static switches may be configured to switch between a primary power source and a secondary power source in case of an interruption of electrical service of the primary power source, allowing for transferring of electric loads between two independent power sources without interruption. For example, static switch 114 is connected to primary power source A and secondary power source B. Static switch 116 is connected to primary power source A and secondary power source C. Static switch 118 is connected to primary power source A and secondary power source D.

Cell 104 also includes power distribution units ("PDU") 120, 122, and 124. PDUs are devices including multiple outputs that are designed to distribute electric power, for example, to racks of servers and networking equipment located within a data center. Although connections are not shown in FIG. 1, PDU 120 is connected to static switch 114, PDU 122 is connected to static switch 116, and PDU 124 is connected to static switch 118.

PDU 120 is configured to provide power from a power source to which it is connected via static switch 114 to one or more rows of server racks. PDU 120 provides such power to the one or more rows of server racks via busways. For example, as shown in FIG. 1, PDU 120 may distribute power from primary power source A via an overhead or underfloor busway system (represented in FIG. 1 as solid lines from PDU 120 through rows of server racks 126, 130, and 132) that is operable to electrically connect PDU 120 to rows of server racks 126, 130, and 132. In the case that primary power source A fails to deliver power, PDU 120 may distribute power from secondary power source B via the same busway system that is operable to electrically connect PDU 120 to rows of server racks 126, 130, and 132.

PDU 122 is similarly configured to provide power from a power source to which it is connected via static switch 116 to one or more rows of server racks. PDU 122 provides such power to the one or more rows of server racks via busways. For example, as shown in FIG. 1, PDU 122 may distribute power from primary power source A via an overhead or an underfloor busway system (represented in FIG. 1 as solid lines from PDU 122 through rows of server racks 136, 138, and 142) that is operable to electrically connect PDU 122 to rows of server racks 136, 138, and 142. In the case primary power source A fails to deliver power, PDU 122 may distribute power from secondary power source C via the busway system that is operable to electrically connect PDU 122 to rows of server racks 136, 138, and 142.

In addition, PDU 124 is similarly configured to provide from a power source to which it is connected via static switch 118 to one or more rows of server racks. PDU 124 provides such power to the one or more rows of server racks via busways. For example, as shown in FIG. 1, PDU 124 may distribute power from primary power source A via an overhead or an underfloor busway system (represented in FIG. 1 as solid lines from PDU 124 through rows of server racks 144, 148, and 150) that is operable to electrically connect PDU 124 to rows of server racks 144, 148, and 150. In the case primary power source A fails to deliver power, PDU 124 may distribute power from secondary power source D via the busway system that is operable to electrically connect PDU 124 to rows of server racks 144, 148, and 150.

As further shown in FIG. 1, row of server racks 126 and row of server racks 130 line up along a hot aisle containment ("HAC") 128, row of server racks 132 and row of server racks 136 line up along a HAC 134, row of server racks 138 and row of server racks 142 line up along a HAC 140, row of server racks 144 and row of server racks 148 line up along a HAC 146, and row of server racks 150 line up along a HAC 152. A HAC is an enclosure that collects hot exhaust air from server rack devices and directs the hot exhaust air out of the data center. Rows of server racks 126, 130, 132, 136, 138, 142, 144, 148, and 150 may include several rack positions, and each rack position may include servers and other types of equipment (e.g., network routers or switches, cooling fans, etc.).

As shown in FIG. 1, cells 106, 108, and 110 have similar power distribution configurations as cell 104. For example, cells 106, 108, and 110 each include three switches configured to provide power from a primary power source or a secondary power source and to connect to a corresponding PDU of three PDUs in a cell. In addition, each PDU of the three PDUs included in cells 106, 108, and 110 provide power via a busway system that is operable to electrically connect a PDU to three rows of server racks.

Based upon this power distribution configuration, in order to utilize the full capacity of the power distribution system 100, the load across the PDUs and static switches in a cell need to be balanced. In addition, the load across PDUs cannot exceed the maximum power assigned to each PDU and each cell within the data center.

Furthermore, due to variability in power needs of workloads, it can be difficult to assign workloads in a data center for maximal utilization of power capacity of a data center. This is further exacerbated by the deployment of workloads to servers at a row level rather than at a rack level. The larger the power needs of workloads assigned to a data center, the less flexibility exists in assigning workloads in a data center (e.g., assignment of power in smaller units such as at a rack level allows for more precise, incremental utilization of the supply of power in order to reach maximum capacity of power). Any inefficiency in power distribution results in PDUs becoming underutilized and power becoming stranded.

For example, let it be determined that data center 102 in FIG. 1 carries a 14,400 kW maximum capacity. Based on this determination, each of data center 102's four cells (104, 106, 108, and 110) carry a maximum power capacity of 3600 kW. Drilling down more granularly, it can be surmised that each of the three PDUs per cell carry a maximum power capacity of 1200 kW (based on the principle of load balancing across all PDUs). Also, as shown in FIG. 1, each PDU services three dedicated rows of server racks (i.e., rows 126, 130, and 132 to PDU 120, rows 136, 138, and 142 to PDU 122, and rows 144, 148, and 150 to PDU 124).

Now, in an example scenario A, consider that the rows of server racks are assigned workloads with a power need of 480 kW and each load on a PDU cannot exceed 1200 kW of power. As a result, the maximum wattage that is provided per PDU is the equivalent of two rows, or 960 kW (as workloads are assigned at a row level). Thus, each PDU faces up to 240 kW of unusable power. Across an entire cell, 720 kW of power will remain untapped. This signifies a 20% underutilization of power (as 720 kW is 20% of the 3600 kW maximum power capacity of the cells of data center 102).

To further illustrate, in an example scenario B, workloads with varying power needs are assigned to rows of server racks in data center 102. For instance, consider that each PDU in cell 104 is servicing a first row that is assigned a workload with a power need of 420 kW, a second row that is assigned a workload with a power need of 300 kW, and a third row that is assigned a workload with a power need of 300 kW. As a result, the wattage that is provided per PDU is 1020 kW. As such, each PDU faces up to 180 kW of unusable power, and across an entire cell, 540 kW of power will remain untapped. This results in a 15% underutilization of power (as 540 kW is 15% of the 3600 kW maximum power capacity of the cells of data center 102).

One solution to combat stranded power is to map a workload to the PDUs that are underutilized within each cell. This helps balance loads across the PDUs for optimal operability and efficiently accommodates the varying levels of workload power requirements experienced across the server rack rows. This solution can be achieved via a segmented busway system in a "recovery row" of server racks that allows multiple PDUs to provide power to the same row of server rack rows. This emerges as a delineation from current power distribution systems, as convention dictates that a single PDU services a fixed row or set of rows, rather than multiple PDUs servicing the same row of server racks.

Figure 2:
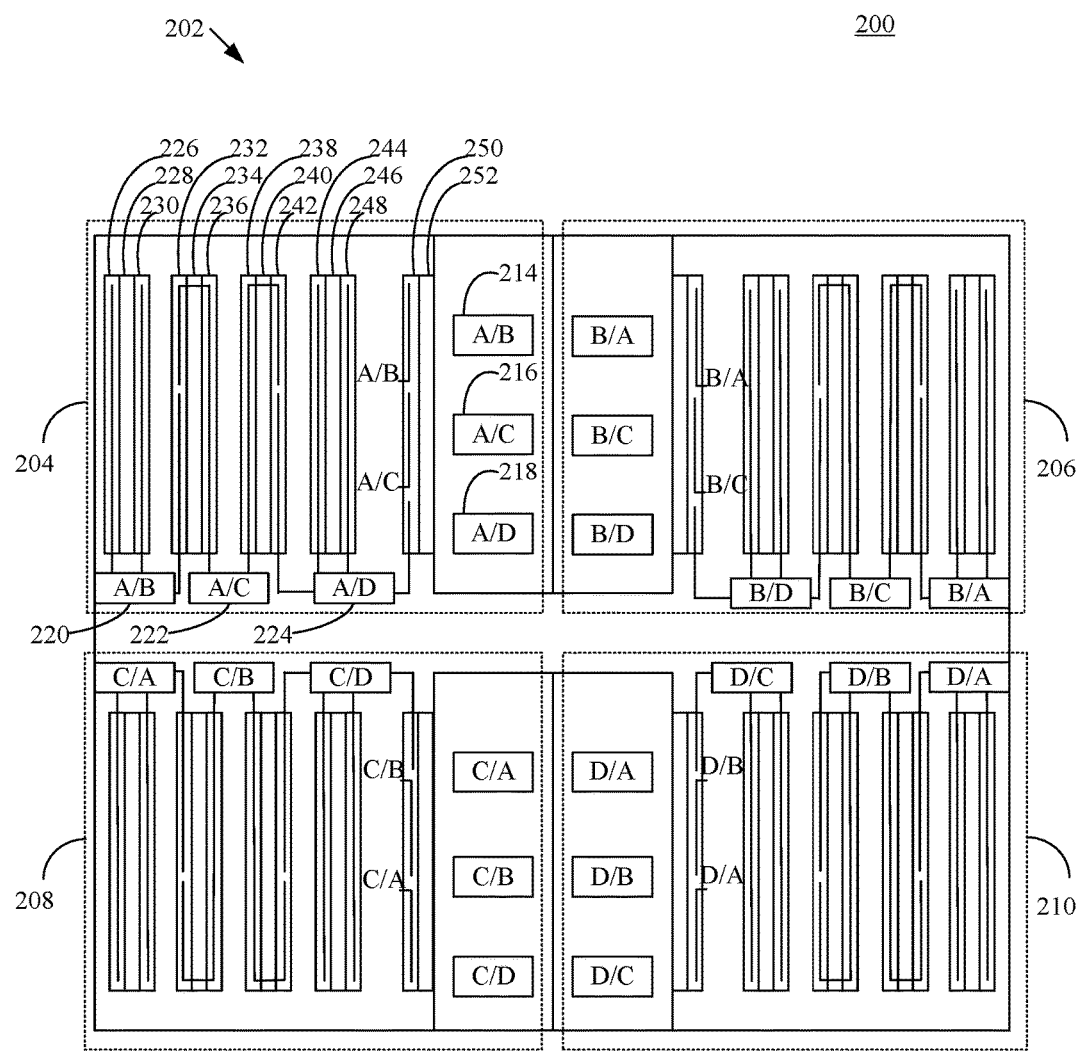
FIG. 2 is a block diagram of an example power distribution system with a segmented busway system for a data center, according to an example embodiment.

FIG. 2 more clearly demonstrates how a segmented busway system functions. Specifically, FIG. 2 shows a block diagram of an example power distribution system 200 with a segmented busway system for a data center 202, according to an example embodiment. Data center 202 is similar to data center 102 featured in FIG. 1 in that it includes four cells—namely, cells 204, 206, 208, and 210. Furthermore, as shown in FIG. 2, cell 204 is provided power from a primary power source A, cell 206 is provided power from a primary power source B, cell 208 is provided power from a primary power source C, and cell 210 is provided power from a primary power source D. In FIG. 2, static switches function in the same fashion as described above with respect to FIG. 1, with static switches 214, 216, and 218 servicing cell 204, for example. Each primary power source also serves as a secondary power source for cells that it is not servicing as a primary power source. For example, static switch 214 is connected to primary power source A and secondary power source B. Static switch 216 is connected to primary power source A and secondary power source C. Static switch 218 is connected to primary power source A and secondary power source D. This same pattern is showcased within cell 206, 208, and 210.

Each cell noted in FIG. 2 includes three PDUs. Each PDU operates to distribute power from a power source to which it is connected via a static switch to various server racks. As an abbreviated example, cell 204 includes PDUs 220, 222, and 224. Although connections are not shown in FIG. 2, PDU 220 is connected to static switch 214, PDU 222 is connected to static switch 216, and PDU 224 is connected to static switch 218. Moreover, the HACs noted in FIG. 2 are placed and operate in the same manner as those discussed above with respect to FIG. 1. Cell 204, for example, will show that HAC 228 services rows 226 and 230, HAC 234 services rows 232 and 236, HAC 240 services rows 238 and 242, HAC 246 services rows 244 and 248, and HAC 252 services row 250.

In regards to racks of server rows, cell 204 will again garner a closer look. PDU 220 is configured to provide power via a busway system to the entire row of rows 226 and 230, a portion of row 232, and a portion of row 250 (although connections are not shown in FIG. 2). In FIG. 2, the "portions" are represented by two thirds of row 232 and one third of row 250, totaling 3 rows of server racks connected to PDU 220 when including rows of 226 and 230. In other embodiments, the rows of server racks may be apportioned differently (e.g., half of a row, quarter of a row, etc.). In line with this example, PDU 222 is configured to provide power via a busway system to the remaining portion of row 232, full rows 236 and 238, a portion of row 242, and a portion of 250 (although connections are not shown in FIG. 2). In FIG. 2, the "portions" are represented by one third of row 232, one third of row 242, and one third of row 250, totaling 3 rows total across PDU 222 when including full rows 236 and 238. Lastly, PDU 224 is configured to provide power via a busway system to the remaining portion of row 242, full rows 244 and 248, and a portion of row 250. In FIG. 2, the "portions" are represented by two thirds of row 242 and one third of row 250, totaling 3 rows total across PDU 224 when including full rows 244 and 248. This behavior follows suit across all PDUs and their corresponding rows of the cells within data center 202 (i.e., cells 206, 208, and 210).

In application, this segmented busway system yields drastically less percentages of stranded power across a data center (noted at 20% in the example regarding FIG. 1). For instance, let it be assumed in the segmented busway system drawn out in FIG. 2 that cell 204 has a wattage of 3600 kW, with 3 PDUs (220, 222, and 224). These PDUs carry a maximum power of 1200 kW each and service rows with workloads with 480 kW power needs. In this example, however, each PDU distributes power in the manner expressed throughout FIG. 2. (e.g., PDU 220 services all of rows 226 and 230, two thirds of 232, and one third of 250). Row 250 emerges as a critical improvement to the data center, as it can connect to all of the three PDUs in cell 204 to receive power.

Specifically, referencing scenario A explained above, this row can be assigned stranded power from PDUs 220, 222, and 224, even in tandem, to service a 480 kW workload power requirement. For example, if row 250 receives an equal amount of power from PDUs 220, 222, and 224 at 160 kW each to satisfy the workload requirement, then the previous stranded power wattage reduces from 240 kW to 80 kW per PDU. Across cell 204, total stranded power shrinks from 720 kW to 240 kW, or 6.6% stranded power (down from 20% in FIG. 1).

Similarly, referencing scenario B explained above, row 250 can utilize equal amounts of stranded power from PDUs 220, 222, and 224 to service a 420 kW workload power requirement. For example, if row 250 receives an equal amount of power from PDUs 220, 222, and 224 at 140 kW each to satisfy the workload requirement, then the previous stranded power wattage reduces from 180 kW to 40 kW per PDU. Across cell 204, total stranded power shrinks from 540 kW to 120 kW, or 3.3% stranded power (down from 15% in FIG. 1). Based on harnessing power from multiple PDUs, rows are able to tap power otherwise wasted. This segmented busway system provides a clean, immediate, and scalable solution to reduce the amount of stranded power.

Instead of a segmented busway, like with row 250, a busway system can be used to provide more flexibility in recovering stranded power from each PDU in a recovery row, no longer limiting PDUs to route their respective power to a predetermined portion of a row of server racks.

Figure 3:
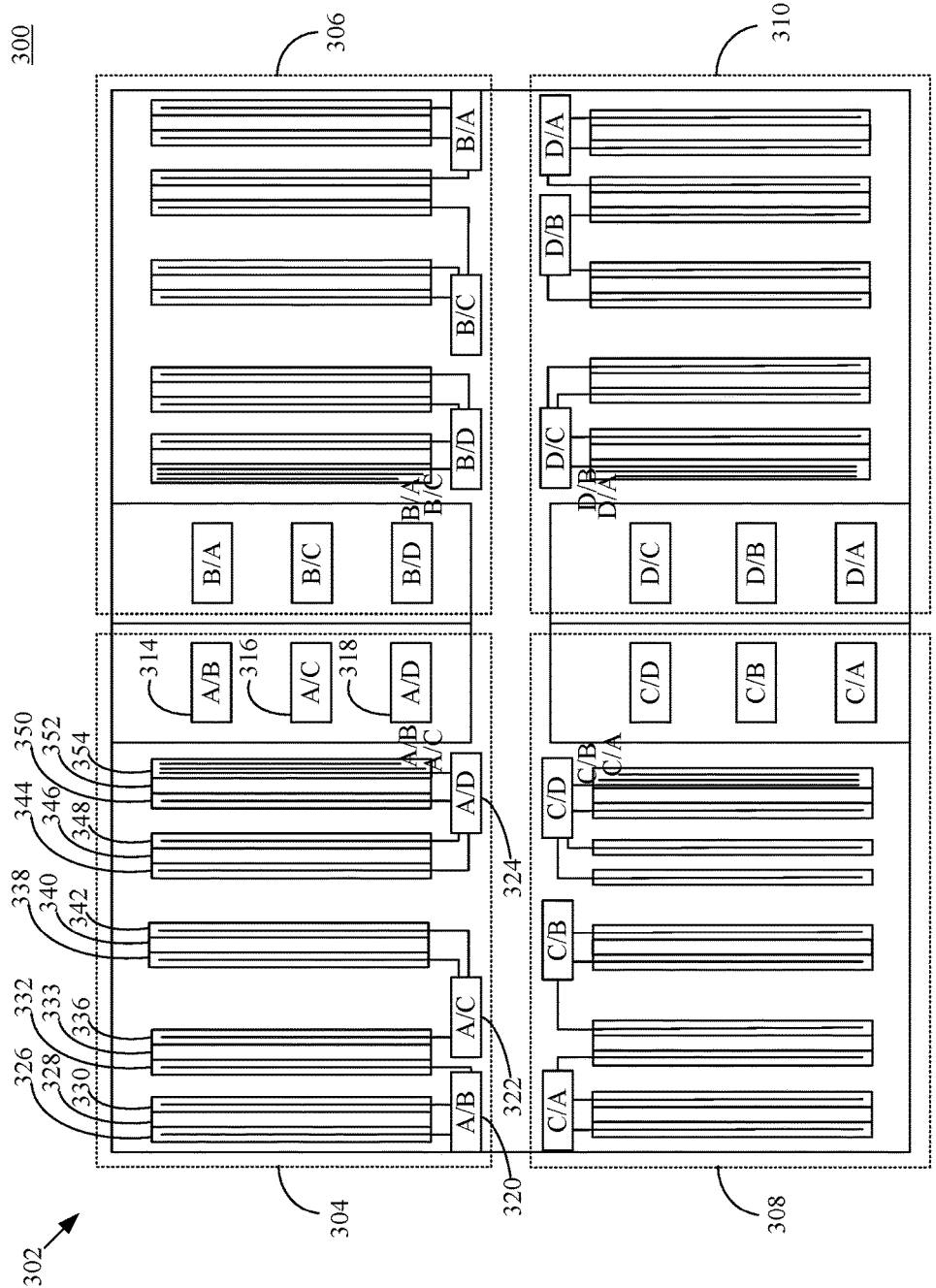
FIG. 3 is a block diagram of an example power distribution system including a flexible busway system for a data center, according to an example embodiment.

For example, FIG. 3 provides an example of a detailed layout of a busway system described above. Specifically, FIG. 3 shows a block diagram of an example power distribution system 300 including a flexible busway system for a data center 302, according to an example embodiment. Data center 302 is similar to data centers 102 and 202 featured in FIGS. 1 and 2 in that it includes four cells—namely, cells 304, 306, 308, and 310. Furthermore, as shown in FIG. 3, cell 304 is provided power from a primary power source A, cell 306 is provided power from a primary power source B, cell 308 is provided power from a primary power source C, and cell 310 is provided power from a primary power source D. In FIG. 3, static switches function in the same fashion as described above with respect to FIGS. 1 and 2, with static switches 314, 316, and 318 servicing cell 304, for example. Each primary power source also serves as a secondary power source for cells that it is not servicing as a primary power source. For example, static switch 314 is connected to primary power source A and secondary power source B. Static switch 316 is connected to primary power source A and secondary power source C. Static switch 318 is connected to primary power source A and secondary power source D. This same pattern is showcased within cell 306, 308, and 310.

Each cell noted in FIG. 3 includes three PDUs. Each PDU operates to distribute power from a power source to which it is connected via a static switch to various server racks. As an abbreviated example, cell 304 includes PDUs 320, 322, and 324. Although connections are not shown in FIG. 3, PDU 320 is connected to static switch 314, PDU 322 is connected to static switch 316, and PDU 324 is connected to static switch 318. Moreover, the HACs noted in FIG. 3 are placed and operate in a similar manner as those discussed above with respect to FIGS. 1 and 2. Cell 304, for example, will show that HAC 328 services rows 326 and 330, HAC 334 services rows 332 and 336, HAC 340 services rows 338 and 342, HAC 346 services rows 344 and 348, and HAC 352 services rows 350 and 354.

In regards to rows of server racks, in cell 304, PDU 320 is configured to provide power via a busway system to the entire rows of server racks 326, 330, and 332, and any amount of row 354 (i.e., from one server rack of row 354 to all server racks of row 354). In addition, PDU 322 is configured to provide power to the entire rows of server racks 336, 338, and 342, and any amount of row 354 (i.e., from one server rack of row 354 to all server racks of row 354). Lastly, PDU 324 is configured to provide power to the entire rows of server racks 344, 348 and 350 and any amount of row 354 (i.e., from one server rack of row 354 to all server racks of row 354). This behavior follows suit across all PDUs and their corresponding rows of the cells within data center 302 (i.e., cells 306, 308, and 310).

In application, using the example described above with reference to FIGS. 1 and 2, it can be assumed that each cell in data center 302 has a wattage of 3600 kW, with 3 PDUs. In cell 304, the corresponding PDUs would include PDU 320, 322, and 324. These PDUs carry a maximum power of 1200 kW each and service rows with workloads requiring 480 kW per row. In this example, however, each PDU distributes power in the manner expressed throughout FIG. 3, in which a single PDU can provide complete power to a row if possible, or just a fraction of the power to the row (e.g., PDU 320 services all of rows 326, 330 and 332, and any amount of power to 354 as to achieve load balancing).

In this embodiment, referencing scenario example A explained above, row 354 can be assigned any combination of stranded power from the three PDUs, even in tandem, to provide power for a 480 kW workload power requirement. To illustrate, assume row 354 receives 240 kW of stranded power from PDU 320, 120 kW from PDU 322, and 120 kW from PDU 324. This means the previous stranded power wattage reduces from 240 kW to zero kW for PDU 320 and down from 240 kW to 120 kW for PDUs 322 and 324. Across cell 304, total stranded power amounts to 240 kW, or 6.6% stranded power (down from 20% in FIG. 1).

The ability to recover a variable amount of power from each PDU not only enables the recovery of stranded power, but also provides a more efficient and flexible manner in balancing loads across PDUs. To illustrate, in an example scenario C, consider that PDUs 320 and 322 are servicing a first row that is assigned a workload with a power need of 420 kW, a second row that is assigned a workload with a power need of 420 kW, and a third row that is assigned a workload with a power need of 300 kW, thereby resulting in PDUs 320 and 322 facing up to 60 kW of unused power. Consider further that PDU 324 is servicing a first row that is assigned a workload with a power need of 420 kW and a second row that is assigned a workload with a power need of 420 kW, thereby resulting in PDU 324 facing up to 360 kW of unused power.

If, in this scenario, a workload with a power need of 420 kW is assigned to cell 304, it could not be assigned to a third row serviced by PDU 324 as it would exceed the maximum power capacity of 1200 kW of PDU 324. However, row 354 could be assigned a combination of stranded power from each PDU, such as 40 kW from PDUs 320 and 322 and 340 kW from PDU 324, to satisfy the 420 kW workload power requirement and balance the load across PDUs 320, 322, and 324, as each PDU is providing a 1180 kW of power. In this scenario, across cell 304, total stranded power amounts to 60 kW, or 1.6% stranded power (down from 20% in FIG. 1).

The physical placement of a recovery row in a data center can also impact power distribution efficiency. To illustrate, by placing the recovery row in the center of a data center, expenditures like equipment, floorspace, and infrastructure are spared. For example, less wiring would be required to connect a busway system in a recovery row to its corresponding PDUs in a data center shown in FIG. 4. In particular, FIG. 4 is a block diagram of an example power distribution system 400 including a flexible busway system in the center of a cell of a data center, according to an example embodiment.

In this embodiment, data center 402 includes cells 404, 406, 408, and 410. In addition, cell 404 is provided power from a primary power source A, cell 406 is provided power from a primary power source B, cell 408 is provided power from a primary power source C, and cell 410 is provided power from a primary power source D. In FIG. 4, static switches function in the a similar fashion to that described above in reference to FIGS. 1, 2, and 3. Each primary power source also serves as a secondary power source for cells that it is not servicing as a primary power source. For example, static switch 414 is connected to primary power source A and secondary power source B. Static switch 416 is connected to primary power source A and secondary power source C. Static switch 418 is connected to primary power source A and secondary power source D. This same pattern is showcased within cell 406, 408, and 410.

Figure 4:
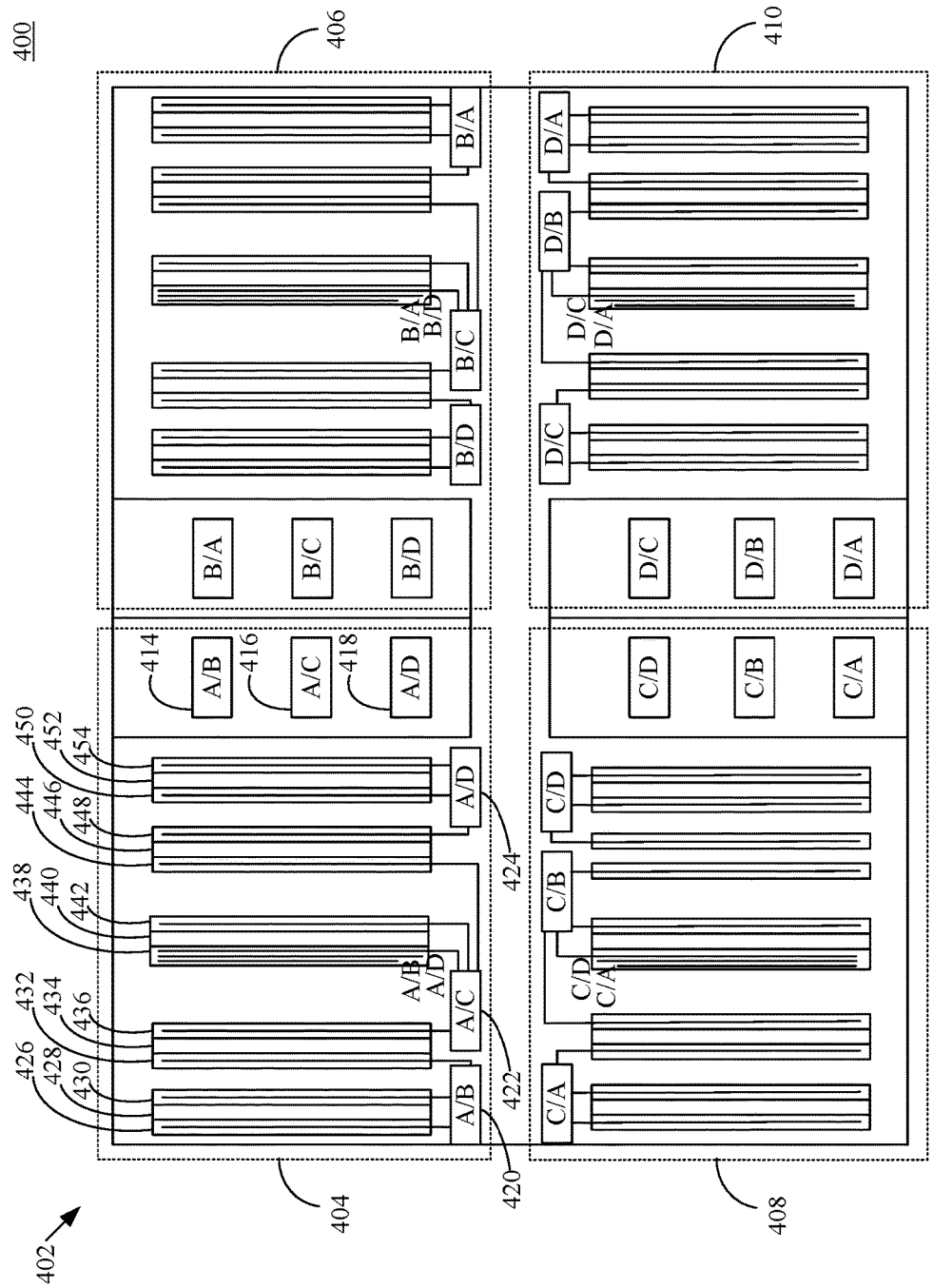
FIG. 4 is a block diagram of an example power distribution system including a flexible busway system in the center of a cell of a data center, according to an example embodiment.

Each cell noted in FIG. 4 includes three PDUs. Each PDU operates to distribute power from a power source to which it is connected via a static switch to various server racks. To demonstrate, cell 404 includes PDUs 420, 422, and 424. Although connections are not shown in FIG. 4, PDU 420 is connected to static switch 414, PDU 422 is connected to static switch 416, and PDU 424 is connected to static switch 418. Moreover, the HACs noted in FIG. 4 are placed and operate in a similar manner as those discussed above with respect to FIGS. 1, 2, and 3. HAC 428 services rows 426 and 430, HAC 434 services rows 432 and 436, HAC 340 services rows 438 and 442, HAC 446 services rows 444 and 448, and HAC 452 services row 450 and 454.

In regards to rows of server racks, in cell 404 of FIG. 4, PDU 420 is configured to provide power to the entire rows of server racks 426, 430, and 432, and any amount to center row 438 (i.e., from one server rack of row 438 to all server racks of row 438). PDU 422 is configured to provide power to the entire rows of server racks 436, 442, and 444, and any amount to center row 438 (i.e., from one server rack of row 438 to all server racks of row 438). Lastly, PDU 424 is configured to provide power to the entire rows of server racks 448, 450, and 454, and any amount to 438 (i.e., from one server rack of row 438 to all server racks of row 438). This behavior can be observed within the remaining three cells of data center 402 (i.e., cells 406, 408, and 410).

By placing the recovery row in the center of the data center, less infrastructure is needed to connect busway systems in row 438 to their corresponding PDUs. For example, in referencing FIGS. 3 and 4, less infrastructure (e.g., conduit, tray, wire) is required to connect PDU 420 to its corresponding busway system in recovery row 438 of FIG. 4 in comparison to connecting PDU row 320 to its corresponding busway system in recovery row 354 of FIG. 3. Nonetheless, in other embodiments, a recovery row may be placed in any row in a data center depending upon the layout or power distribution infrastructure of a data center.

Figure 5:
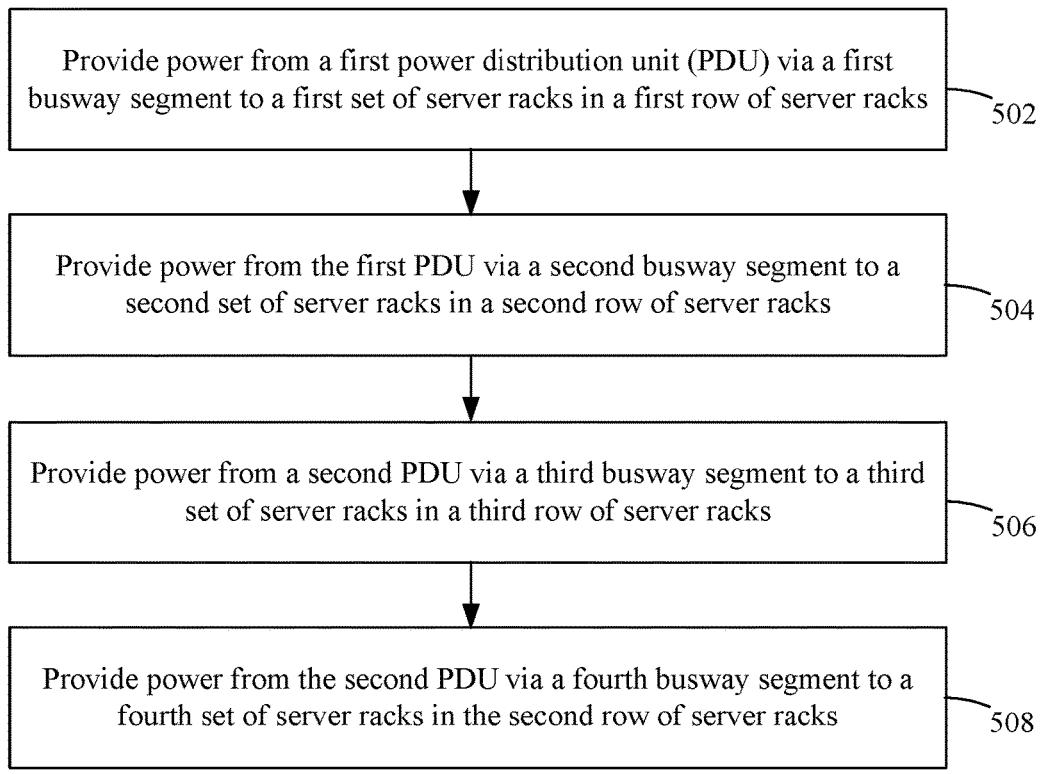
FIG. 5 depicts a flowchart of a method for recovering power from a first and second underutilized PDU, according to an example embodiment.

Systems 200, 300, and 400 may operate in various ways to enable the recovery of stranded power in a data center. For instance, in embodiments, systems 200, 300, and 400 may operate according to FIG. 5. FIG. 5 depicts a flowchart 500 of a method for recovering power from a first and second underutilized PDU, according to an example embodiment. Even though each of systems 200, 300, and 400 of FIGS. 2-4 can operate according to FIG. 5, FIG. 5 will be described in further detail with continued reference to FIG. 3. However, other structural and operational embodiments will be apparent to persons skilled in the relevant art(s) based on the following discussion regarding flowchart 500.

As shown in FIG. 5, the method of flowchart 500 begins at step 502. In step 502, power from a first PDU is provided via a first busway segment to a first set of server racks in a first row of server racks. For example, and with continued reference to FIG. 3, power is provided from PDU 320 via a first busway segment (represented in FIG. 3 as a solid line from PDU 320 through row of server racks 326) to a first set of server racks in row of server racks 326.

At step 504, power from the first PDU is provided via a second busway segment to a second set of server racks in a second row of server racks. For example, and with continued reference to FIG. 3, although connections are not show in FIG. 3, power from PDU 320 is provided via a second busway segment (represented in FIG. 3 as a solid line through row of server racks 354) to a second set of server racks in row of server racks 354.

At step 506, power is provided from a second PDU via a third busway segment to a third set of server racks in a third row of server racks. For example, and with continued reference to FIG. 3, power from PDU 322 is provided via a third busway segment (represented in FIG. 3 as a solid line from PDU 322 through row of server racks 336) to a third set of server racks in row of server racks 336.

At step 508, power is provided from the second PDU via a fourth busway segment to a fourth set of server racks in the second row of server racks. For example, and with continued reference to FIG. 3, although connections are not show in FIG. 3, power from PDU 322 is provided via a fourth busway segment (represented in FIG. 3 as a solid line through row of server racks 354) to a fourth set of server racks in row of server racks 354.

In embodiments, the second set of server racks in row of server racks 354 and the fourth set of server racks in row of server racks 354 may be non-overlapping (e.g., the second set may comprise a first half of server racks of row 354 while the fourth set may comprise a second half of server racks of row 354 and vice versa). In addition, in embodiments, the first set of server racks may be larger than the second set of server racks (e.g., assuming rows include the same number of racks, the first set may include all the server racks in row 326, while the second set of server racks may include a first half of server racks of row 354) and the third set of server racks may be larger than the fourth set of server racks (e.g., assuming rows include the same number of racks, the third set may include all the server racks in row 336, while the second set of server racks may include a second half of server racks of row 354).

Still yet, in embodiments, assuming the number of server racks in each row of server racks is the same, the first set of server racks may comprise all of the server racks in the first row of server racks (e.g., all the server racks in row 326), the second set of server racks may comprise a first portion of the server racks in the second row of server racks (e.g., a first portion of server racks in row 354), the third set of server racks may comprise all of the server racks in the third row of server racks (e.g., all the server racks in row 336), and the fourth set of server racks may comprise a second portion of the server racks in the second row of server racks (e.g., a second portion of server racks in row 354). Furthermore, the first portion of the server racks in row 354 of server racks may be the same as the number of server racks in the second portion of the server racks in row 354 of server racks.

Figure 6:
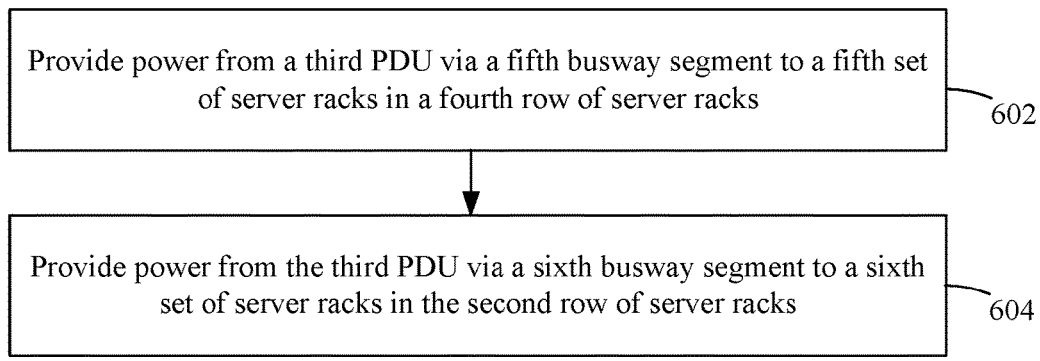
FIG. 6 depicts a flowchart 600 of a method for recovering power from a third underutilized PDU, according to an example embodiment.

For instance, in embodiments, systems 200, 300, and 400 may operate according to FIG. 6. FIG. 6 depicts a flowchart 600 of a method for recovering power from a third under-utilized PDU, according to an example embodiment. Even though each of systems 200, 300, and 400 can operate according to FIG. 6, FIG. 6 will be described in further detail with continued reference to FIG. 3. However, other structural and operational embodiments will be apparent to persons skilled in the relevant art(s) based on the following discussion regarding flowchart 600.

As shown in FIG. 6, the method of flowchart 600 begins at step 602. In step 602, power is provided from a third PDU via a fifth busway segment to a fifth set of server racks in a fourth row of server racks. For example, and with continued reference to FIG. 3, power is provided from PDU 324 via a busway segment (represented in FIG. 3 as a solid line from PDU 324 through row of server racks 344) to a fifth set of server racks in row of server racks 344.

At step 604, power is provided from the third PDU via a sixth busway segment to a sixth set of server racks in the second row of server racks. For example, and with continued reference to FIG. 3, although connections are not show in FIG. 3, power is provided from PDU 324 via a sixth busway segment (represented in FIG. 3 as a solid line through row of server racks 354) to a sixth set of server racks in row of server racks 354. In embodiments, the second set of server racks described in FIG. 5, the fourth set of server racks described in FIG. 5, and the sixth set of server racks described in FIG. 6 in row of server racks 354 are non-overlapping. In addition, in some embodiments, PDUs 320, 322, and 324 may be configured to provide power to the second set of server racks described in FIG. 5, the fourth set of server racks described in FIG. 5, and the sixth set of server racks described in FIG. 6 in row of server racks 354, in which the sets are overlapping. Moreover, PDUs 320, 322, and 324 may be configured to provide power to the second set of server racks described in FIG. 5, the fourth set of server racks described in FIG. 5, and the sixth set of server racks described in FIG. 6 in row of server racks 354, in which each set comprises all the server racks in the second row of server racks.

III. Additional Example Embodiments

In an embodiment, a power distribution system for a data center, comprises a first power distribution unit (PDU), a first busway segment that is operable to electrically connect the first PDU to a first set of server racks in a first row of server racks, a second busway segment that is operable to electrically connect the first PDU to a second set of server racks in a second row of server racks, a second PDU, a third busway segment that is operable to electrically connect the second PDU to a third set of server racks in a third row of server racks, and a fourth busway segment that is operable to electrically connect the second PDU to a fourth set of server racks in the second row of server racks.

In an embodiment of the foregoing power distribution system, the second set of server racks in the second row of server racks and the fourth set of server racks in the second row of server racks are non-overlapping.

In an embodiment of the foregoing power distribution system, the second set of server racks in the second row of server racks and the fourth set of server racks in the second row of server racks are overlapping.

In an embodiment of the foregoing power distribution system, the second set of server racks in the second row of server racks and the fourth set of server racks in the second row of server racks each comprise all the server racks in the second row of server racks.

In an embodiment of the foregoing power distribution system, the first set of server racks is larger than the second set of server racks and the third set of server racks is larger than the fourth set of server racks.

In an embodiment of the foregoing power distribution system, the number of server racks in each row of server racks is the same, the first set of server racks comprises all of the server racks in the first row of server racks, the second set of server racks comprises a first portion of the server racks in the second row of server racks, the third set of server racks comprises all of the server racks in the third row of server racks, and the fourth set of server racks comprises a second portion of the server racks in the second row of server racks.

In an embodiment of the foregoing power distribution system, the number of server racks in the first portion of the server racks in the second row of server racks is the same as the number of server racks in the second portion of the server racks in the second row of server racks.

In an embodiment of the foregoing power distribution system, further comprises a third PDU, a fifth busway segment that is operable to electrically connect the third PDU to a fifth set of server racks in a fourth row of server racks, and a sixth busway segment that is operable to electrically connect the third PDU to a sixth set of server racks in the second row of server racks.

In an embodiment of the foregoing power distribution system, the second set of server racks in the second row of server racks, the fourth set of server racks in the second row of server racks, and the sixth set of server racks in the second row of server racks are non-overlapping.

In an embodiment of the foregoing power distribution system, the second set of server racks in the second row of server racks, the fourth set of server racks in the second row of server racks, and the sixth set of server racks in the second row of server racks are overlapping.

In an embodiment of the foregoing power distribution system, the second set of server racks in the second row of server racks, the fourth set of server racks in the second row of server racks, and the sixth set of server racks in the second row of server racks each comprise all the server racks in the second row of server racks.

In another embodiment, a method for power distribution in a data center, comprising: providing power from a first power distribution unit (PDU) via a first busway segment to a first set of server racks in a first row of server racks; providing power from the first PDU via a second busway segment to a second set of server racks in a second row of server racks; providing power from a second PDU via a third busway segment to a third set of server racks in a third row of server racks; and providing power from the second PDU via a fourth busway segment to a fourth set of server racks in the second row of server racks.

In an embodiment of the foregoing method, the second set of server racks in the second row of server rack and the fourth set of server racks in the second row of server racks are non-overlapping.

In an embodiment of the foregoing method, the first set of server racks is larger than the second set of server racks and the third set of server racks is larger than the fourth set of server racks.

In an embodiment of the foregoing method, the number of server racks in each row of server racks is the same, the first set of server racks comprises all of the server racks in the first row of server racks, the second set of server racks comprises a first portion of the server racks in the second row of server racks, the third set of server racks comprises all of the server racks in the third row of server racks, and the fourth set of server racks comprises a second portion of the server racks in the second row of server racks.

In an embodiment of the foregoing method, the number of server racks in the first portion of the server racks in the second row of server racks is the same as the number of server racks in the second portion of the server racks in the second row of server racks.

In an embodiment of the foregoing method, further comprises: providing power from a third PDU via a fifth busway segment to a fifth set of server racks in a fourth row of server racks; and providing power from the third PDU via a sixth busway segment to a sixth set of server racks in the second row of server racks.

In an embodiment of the foregoing method, the second set of server racks in the second row of server racks, the fourth set of server racks in the second row of server racks, and the sixth set of server racks in the second row of server racks are non-overlapping.

In still another embodiment, a power distribution system for a data center, comprises a first row of server racks; a first busway that is operable to deliver power from a first power distribution unit (PDU) to each server rack in the first row of server racks; a second row of server racks; a second busway that operable to deliver power from a second PDU to each server rack in the second row of server racks; a third row of server racks; and a third busway that is operable to deliver power from the first PDU to each server rack in the third row of server racks; and a fourth busway that is operable to deliver power from the second PDU to each server rack in the third row of server racks.

In an embodiment of the foregoing power distribution system, further comprises: a fourth row of server racks; a fifth busway that is operable to deliver power from a third PDU to each server rack in the fourth row of server racks; and a sixth busway that is operable to deliver power from the third PDU to each server rack in the third row of server racks.

IV. Conclusion

While various embodiments have been described above, it should be understood that they have been presented by way of example only, and not limitation. It will be apparent to persons skilled in the relevant art(s) that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A power distribution system for a data center, comprising:
   a first power distribution unit (PDU);
   a first busway segment that is operable to electrically connect the first PDU to a first row of server racks, the first busway segment being an exclusive busway segment by which the first row of server racks can receive power;
   a second busway segment that is operable to electrically connect the first PDU to a first set of server racks in a second row of server racks;
   a second PDU;
   a third busway segment that is operable to electrically connect the second PDU to a third row of server racks, the third busway segment being an exclusive busway segment by which the third row of server racks can receive power;
   a fourth busway segment that is operable to electrically connect the second PDU to a second set of server racks in the second row of server racks, wherein the first, second and third rows of server racks are parallel to one another;
   a first switch configured to selectively couple the first PDU to one of a first power source and a second power source to provide power therefrom; and
   a second switch configured to selectively couple the second PDU to one of the first power source and a third power source to provide power therefrom.

2. The power distribution system of claim 1, wherein the first set of server racks in the second row of server racks and the second set of server racks in the second row of server racks are non-overlapping.

3. The power distribution system of claim 1, wherein the first set of server racks in the second row of server racks and the second set of server racks in the second row of server racks are overlapping.

4. The power distribution system of claim 3, wherein the first set of server racks in the second row of server racks and the second set of server racks in the second row of server racks each comprise all the server racks in the second row of server racks.

5. The power distribution system of claim 1, wherein the first row of server racks is larger than the first set of server racks and the third row of server racks is larger than the second set of server racks.

6. The power distribution system of claim 5, wherein the number of server racks in each row of server racks is the same, the first set of server racks comprises a first portion of the server racks in the second row of server racks, and the second set of server racks comprises a second portion of the server racks in the second row of server racks.

7. The power distribution system of claim 6, wherein the number of server racks in the first portion of the server racks in the second row of server racks is the same as the number of server racks in the second portion of the server racks in the second row of server racks.

8. The power distribution system of claim 1, further comprising:
 a third PDU;
 a fifth busway segment that is operable to electrically connect the third PDU to a fourth row of server racks; and
 a sixth busway segment that is operable to electrically connect the third PDU to a third set of server racks in the second row of server racks.

9. The power distribution system of claim 8, wherein the first set of server racks in the second row of server racks, the second set of server racks in the second row of server racks, and the third set of server racks in the second row of server racks are non-overlapping.

10. The power distribution system of claim 8, wherein the first set of server racks in the second row of server racks, the second set of server racks in the second row of server racks, and the third set of server racks in the second row of server racks are overlapping.

11. The power distribution system of claim 10, wherein the first set of server racks in the second row of server racks, the fourth second set of server racks in the second row of server racks, and the third set of server racks in the second row of server racks each comprise all the server racks in the second row of server racks.

12. A method for power distribution in a data center, comprising:
 providing power from a first power distribution unit (PDU) via a first busway segment to a first row of server racks, the first busway segment being an exclusive busway segment by which the first row of server racks can receive power;
 providing excess power from the first PDU via a second busway segment to a first set of server racks in a second row of server racks to service a workload power requirement of the second row of server racks, the excess power from the first PDU resulting from a workload assignment to the first row of server racks;
 providing power from a second PDU via a third busway segment to a third row of server racks, the third busway segment being an exclusive busway segment by which the third row of server racks can receive power; and
 providing excess power from the second PDU via a fourth busway segment to a second set of server racks in the second row of server racks to service the workload power requirement of the second row of server racks, the excess power from the second PDU resulting from a workload assignment to the third row of server racks;

wherein the first, second and third rows of server racks are parallel to one another.

13. The method of claim 12, wherein the first set of server racks in the second row of server racks and the second set of server racks in the second row of server racks are non-overlapping.

14. The method of claim 12, wherein the first row of server racks is larger than the first set of server racks and the third row of server racks is larger than the second set of server racks.

15. The method of claim 14, wherein the number of server racks in each row of server racks is the same, the first set of server racks comprises a first portion of the server racks in the second row of server racks, and the second set of server racks comprises a second portion of the server racks in the second row of server racks.

16. The method of claim 15, wherein the number of server racks in the first portion of the server racks in the second row of server racks is the same as the number of server racks in the second portion of the server racks in the second row of server racks.

17. The method of claim 12, further comprising:
 providing power from a third PDU via a fifth busway segment to a fourth row of server racks; and
 providing power from the third PDU via a sixth busway segment to a third set of server racks in the second row of server racks.

18. The method of claim 17, wherein the first set of server racks in the second row of server racks, the second set of server racks in the second row of server racks, and the third set of server racks in the second row of server racks are non-overlapping.

19. A power distribution system for a data center, comprising:
 a first row of server racks;
 a first busway that is operable to deliver power from a first power distribution unit (PDU) to each server rack in the first row of server racks, the first busway being an exclusive busway by which the first row of server racks can receive power;
 a second row of server racks;
 a second busway that is operable to deliver power from a second PDU to each server rack in the second row of server racks, the second busway being an exclusive busway by which the second row of server racks can receive power;
 a third row of server racks, wherein the first, second and third rows of server racks are parallel to one another;
 a third busway that is operable to deliver power from the first PDU to each server rack in the third row of server racks; and
 a fourth busway that is operable to deliver power from the second PDU to each server rack in the third row of server racks;
 wherein excess power from the first PDU and the second PDU that results from respective workload assignments to the first and second rows of server racks is provided via the third busway and the fourth busway, respectively, to service a workload power requirement of the third row of server racks.

20. The power distribution system of claim 19, further comprising:
 a fourth row of server racks;
 a fifth busway that is operable to deliver power from a third PDU to each server rack in the fourth row of server racks; and a sixth busway that is operable to deliver power from the third PDU to each server rack in the third row of server racks.

\* \* \* \* \*